Aug. 22, 1961 H. W. ABBOTT ET AL 2,997,659

SEMICONDUCTOR DIODE AMPLIFIER

Filed Feb. 19, 1958 2 Sheets-Sheet 1

INVENTORS:
HAROLD W. ABBOTT,
LAWRENCE D. WECHSLER,
BY Walter C. Bemkopf
THEIR ATTORNEY.

INVENTORS:
HAROLD W. ABBOTT,
LAWRENCE D. WECHSLER,
BY Walter C. Bernkopf
THEIR ATTORNEY, United States Patent Office 2,997,659

Patented Aug. 22, 1961

2,997,659

SEMICONDUCTOR DIODE AMPLIFIER

Harold W. Abbott, Albany, and Lawrence D. Wechsler, Syracuse, N.Y., assignors to General Electric Company, a corporation of New York Filed Feb. 19, 1958, Ser. No. 716,193
7 Claims. (Cl. 330—34)

This invention relates to electrical circuits including semiconductor devices. More particularly, this invention relates to electrical circuits such as amplifiers or wave modifying circuits utilizing a semiconductor storage diode as the active element thereof.

It is well known that semiconductor junction diodes, in addition to having a barrier capacitance storage effect which is noticeable at high frequencies, also exhibit another storage effect which determines their response at considerably lower frequencies if the diode is biased in the forward direction for a part of the cycle of an applied high frequency voltage. This latter storage effect produces a transient phenomenon in that when a voltage applied to a diode having proper characteristics is switched rapidly from forward to reverse polarity a large reverse current flows for an appreciable time after switching takes place with a subsequent decay of this reverse current until the static reverse state of low conductivity is reached. The storage effect, manifesting this action, consists of the temporary storage of minority carriers which were injected during the time the diode was forwardly biased. Virtually any diode of semiconductor material having a p-n junction therein will exhibit this storage effect to a certain degree depending upon the type of diode and the frequency at which it is operated. However, it is convenient to restrict the definition of the term "storage diode" to mean any diode having a characteristic such that when energized by a voltage varying in polarity at an appropriate frequency it will exhibit this storage effect to a substantial or useable degree. For a more complete discussion of the semiconductor physics involved in this storage effect, reference is made to an article by Robert H. Kingston entitled "Switching Time in Junction Diodes and Junction Transistors" appearing at pp. 829–834 of vol. 42 of the "Proceedings of the Institute of Radio Engineers" for May 1954 or to an article by R. G. Shulman and M. E. McMahon entitled "Recovery Currents in Germanium PN Junction Diodes" appearing at pp. 1267–1272 of vol. 24 of the "Journal of Applied Physics" for October 1953. Semiconduct diode circuits utilizing this storage effect have been previously described in an article entitled "Diode Amplifiers" which appeared in the magazine "Electronic Design" at pp. 24 and 25 of the issue of October 1954, and additional improved circuits have been disclosed and claimed in the copending application S.N. 716,194, now Patent No. 2,976,429, issued March 21, 1961, of Harold W. Abbott and Lawrence D. Wechsler, filed concurrently herewith and assigned to the same assignee as the present application. The diode amplifier stages disclosed therein provided for voltage gain but no current gain and in general had the characteristics of common base transistor circuits, e.g. providing an output impedance greater than the input impedance of the circuit.

The use of diode amplifiers has been limited by the fact that prior art diode amplifier stages have had a current gain less than unity. This has made it impossible in the past to achieve storage diode circuit configurations having the characteristics of either common emitter or common collector transistor stages. Diode amplifier circuits having only current gain and having characteristics of common collector transistor stages, such as an input impedance of higher magnitude than its output impedance, have been disclosed and claimed in the copending application S.N. 716,210, now Patent No. 2,981,881, issued April 25, 1961, of Harold W. Abbott and Lawrence D. Wechsler, filed concurrently herewith and assigned to the same assignee as the present application.

It is therefore an object of this invention to provide improved diode amplifier stages which exhibit both a voltage and current gain.

It is a further object of this invention to provide improved amplifier circuits employing such diode amplifier stages.

It is a further object of this invention to provide various wave modifying and wave shaping circuits, such as multivibrators, employing such diode amplifier stages.

Briefly in accordance with one aspect of the invention, storage diode amplification providing both voltage and current gain is achieved by controlling forward current flow through a storage diode as a function of an applied input signal. Current amplification is achieved in view of a series circuit including the storage diode, current limiting means, i.e. an impedance, charge storage means, such as a capacitor, and a voltage source which supplies first and second successive identical waveform segments of opposite polarity. It is a characteristic of a storage diode that upon application of equal forward and reverse bias waveform segments, the average diode forward current exceeds the average reverse current. With no input signal applied to the diode, the excess forward current during each cycle of the applied source waveform causes a net charge to accumulate on the charge storage means which biases the storage diode to cut off. An input signal applied across the charge storage means, by providing a small input current which alters the charge on the charge storage means, can control storage diode forward conduction. Current amplification is achieved in that a small amplitude current signal can control the diode reverse impedance which is a function of diode forward current and thus, when a load is connected across the diode and charge storage means, can control a large variation in load current. Additionally voltage amplification is made possible by placing a unilaterally conducting device, i.e., a rectifier which does not have storage properties, in parallel with the series combination of the diode and the charge storage means. The rectifier is poled in the same direction as the storage diode, so that both devices are simultaneously forward biased by the voltage source signal. Although the total forward current flow through the series circuit, i.e., the sum of the storage diode and the rectifier forward currents, is determined by the characteristics of the voltage source and the current limiting means, the current flow through the storage diode in respect to the rectifier, while both devices are forward biased, is controlled by the voltage level of the input signal applied across the charge storage means which appears across the series combination of storage diode and the rectifier. It may be seen that the voltage across the storage diode is a function of the voltage amplitude of the input signal. The input voltage level, by controlling the storage diode forward bias voltage level, controls the diode forward current, and additionally the reverse current since the latter is a function of the forward current. Small variations in input signal voltage result in large voltage variations of a load connected across the series combination of the storage diode and the charge storage means because a small voltage variation across the low magnitude forward impedance of the diode is capable of producing a large voltage variation in view of a large variation of reverse impedance of the diode.

While the specification concludes with claims particularly pointing out and distinctly claiming the invention, it is believed that the invention will be better understood if the following description is taken in connection with the accompanying drawings, in which:

Figure 1:
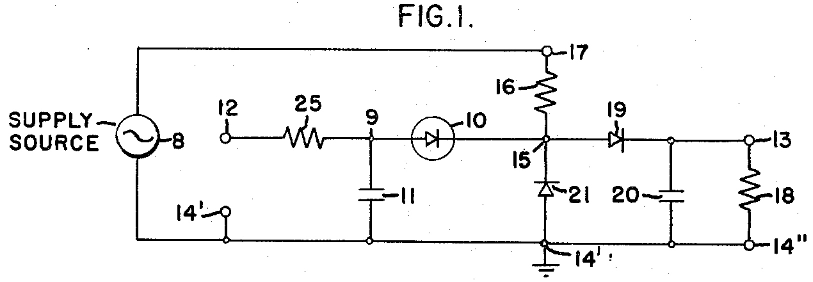
FIG. 1 is a schematic circuit diagram of one embodiment of a diode amplifier having both voltage and current gain.
Figure 4:
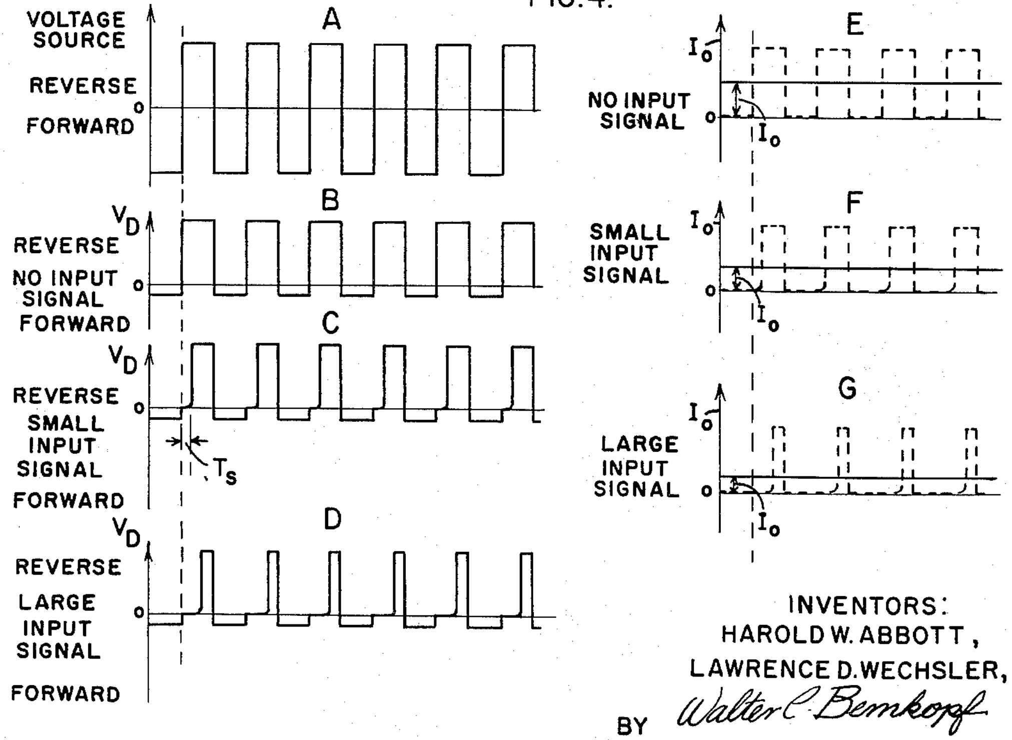
Figure 5:
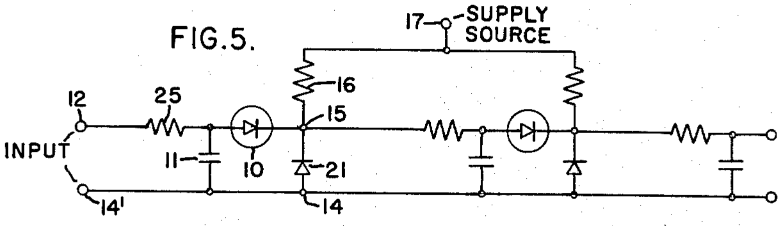
Figure 6:
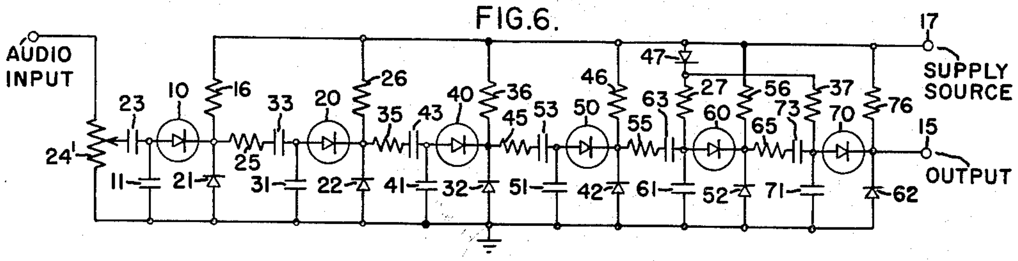
Figure 7:
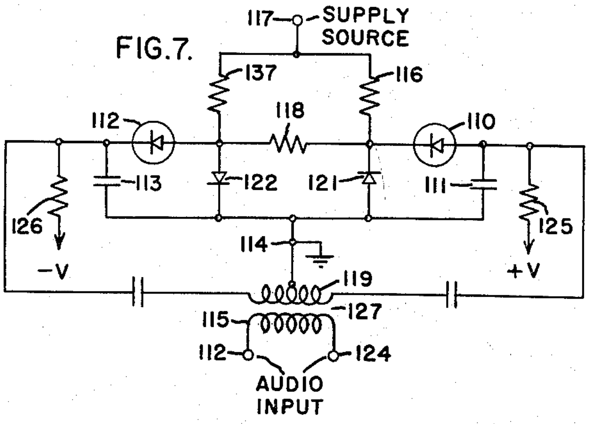
Figure 8:
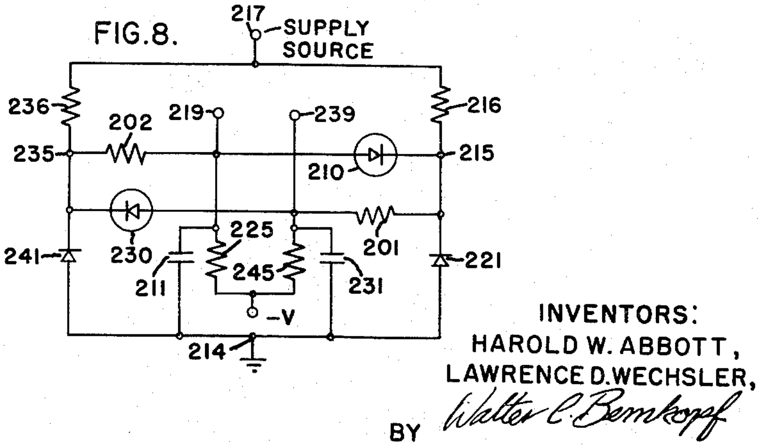

FIG. 4 is a group of waveforms drawn on a common time scale illustrating the relationship in a circuit as illustrated in FIG. 1 between the source voltage, the voltage across the rectifier, and the output current, in which FIG. 4–A illustrates the voltage-time relationship of the source voltage, FIG. 4–B illustrates the rectifier voltage-time relationship with no applied input signal, FIG 4–C illustrates the rectifier voltage-time relationship with a small amplitude applied input signal, FIG. 4–D illustrates the rectifier voltage-time relationship with a large amplitude applied input signal, FIG. 4–E illustrates the output current-time relationship with no applied input signal, FIG. 4–F illustrates the output current-time relationship with a small amplitude applied input signal, and FIG. 4–G illustrates the output current-time relationship with a large amplitude applied input signal;

FIG. 5 is a schematic circuit diagram of a direct coupled diode amplifier of the type disclosed in FIG. 1;

FIG. 6 is a schematic circuit diagram of a multi-stage A.-C. coupled audio amplifier employing the diode amplifiers disclosed in FIG. 1;

FIG. 7 is a schematic circuit diagram of a push-pull amplifier incorporating diode amplifiers of the type disclosed in FIG. 1; and FIG. 8 is a circuit diagram of a dynamic "flip-flop," or multivibrator circuit using the diode amplifier of FIG. 1.

Referring now to FIG. 1, there is shown a diode amplifier circuit including storage diode 10. In one particular embodiment of the invention, storage diode 10 was a General Electric type 1N93 diode. However, any diode falling within the above definition of a storage diode may be used. The storage diode is shown connected serially with a charge storage means 11, such as a capacitor, with the anode terminal 9 of the diode 10 being connected to one side of capacitor 11, whose other side is connected to ground terminal 14. A rectifier 21, which does not have the storage properties of diode 10, is connected in parallel with the series combination of the storage diode and the charge storage means, the cathode terminal 15 of the storage diode being connected to the cathode terminal of rectifier 21 and the anode terminal of rectifier 21 being connected to ground terminal 14. The series impedance 16, i.e. current limiting means, is connected in series with the parallel combination of the storage diode and the rectifier, being connected from cathode terminal 15 of the storage diode to input source terminal 17. The impedance 16 should be in the form of a resistor for optimum performance. A suitable voltage source 8 of suitable frequency is connected between terminals 17 and 14. The signal supplied by source 8 should have identically shaped first and second waveform segments of opposite polarity but need not conform to any one specific wave shape, although a signal of sinusoidal waveform or a square wave signal is preferred. The frequency of the signal must be sufficiently high so that the storage diode 10 exhibits adequate storage characteristics but should be low enough so as to avoid the deleterious effect of barrier capacitance. Input signal means, coupled across the charge storage means and adapted to be coupled to an associated input signal, consist of an input terminal 14′ connected to ground terminal 14 and an input signal terminal 12 connected to the anode terminal 9 of diode 10 through coupling resistor 25. The coupling resistor forms no integral part of the actual amplifying circuitry but is merely included as a matching device for coupling the output impedance of the circuit supplying the input signal to the input impedance of the diode amplifier. The magnitude of capacitor 11 should be selected so as to provide a low reactance to the applied source signal and a high reactance to the input signal appearing at terminals 12 and 14′. It should be noted here that it has been found desirable to limit the maximum frequency of the input signal to about one-tenth of the frequency of the source signal applied across the storage diode. This permits selection of the magnitude of capacitor 11, so that it provides a low reactance to the source signal but a high reactance to the input signal. The circuit output is taken from terminals 15 and 14, i.e., across rectifier 21, and is rectified by rectifier 19 and filtered by filtering means 20 prior to application to a load, indicated as resistor 18, which is connected across output terminals 13 and 14″. Rectifier 19, which is serially connected between terminals 15 and 13, and filter 20, connected across terminals 13 and 14″, are utilized to provide a unidirectional output devoid of source frequency components and are not necessary components of the actual amplifier circuit.

Figures 2, 3:
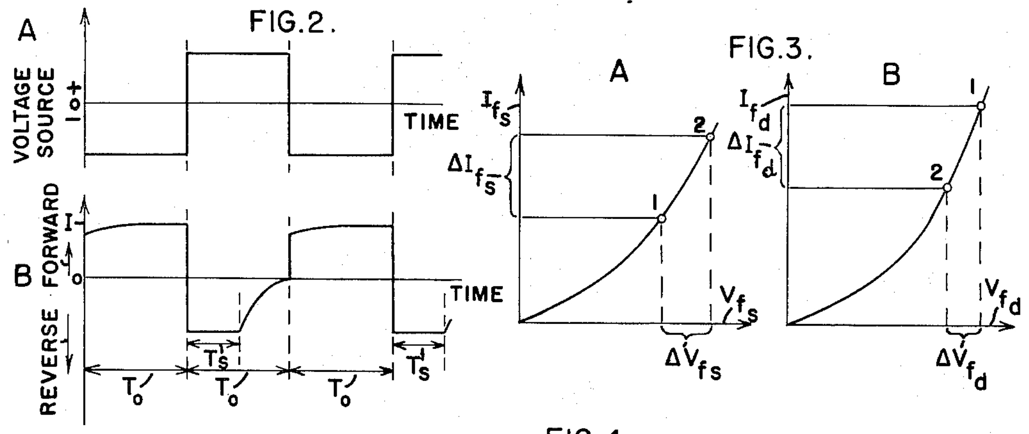
FIG. 2 is a waveform diagram illustrating the voltage and current relationship in a storage diode, with FIG. 2–A illustrating the source voltage and FIG. 2–B, drawn on a common time scale, illustrating forward and reverse current through the diode connected in series with a current limiting resistor to the voltage source.
FIG. 3 is a graph of the D.-C. forward characteristics of a storage diode and a rectifier as employed in the circuit of FIG. 1, with FIG. 3–A illustrating the characteristics of the storage diode and FIG. 3–B illustrating the characteristics of the rectifier.

The operation of the circuit of FIG. 1 may more readily be understood by an initial reference to basic storage diode operation. The storage phenomenon, which forms the basis for diode amplifier circuitry, is well known. When a storage diode is biased in the forward direction so that current flow takes place through the diode, there is a reduction in the space charge which normally restricts all electron and hole travel across the junction. This reduction of the space charge barrier permits holes to flow into the N region and electrons to flow into the P region of the diode. If the voltage applied to the diode is quickly switched from the forward to the reverse bias direction, a large reverse current flows for a time as a result of the return flow of the previously injected minority carriers. FIG. 2 graphically illustrates the current flow through a storage diode, connected through a current limiting resistor to a voltage source, during the application of successive forward and reverse bias voltages. It is assumed that the bipolar source signal applied to the storage diode consists of a square wave having positive and negative cyclic periods of equal time duration, indicated in FIG. 2 as $T_o$, and of equal and opposite amplitude. FIG. 2–B illustrates that a substantially constant amplitude current flows through the diode while it is biased in the forward direction, but further illustrates that the reverse current amplitude is constant only for a shorter storage time period indicated at $T_s$. Subsequent to this storage time period the reverse current decays in amplitude when the remaining stored minority carriers are insufficient to maintain a constant amplitude reverse current. The storage time is limited because of the failure of the diode to store a quantity of carriers equivalent to the entire forward current, and additionally because of the internal recombination of stored minority carriers with majority carriers. It can thus be seen that the average forward current exceeds the average reverse current. Therefore, there is a net forward diode current during each cycle of the source signal. Referring again to FIG. 1, it may be seen that the storage diode is forward biased when a negative potential is applied by source 8 to terminal 17, so that the net forward diode current causes a net charge to build up on capacitor 11. This results in a negative capacitor bias potential which appears at anode terminal 9 of storage diode 10 and cuts off conduction of the diode. When diode 10 is biased to cut off, there can be no storage and there can be no conduction in the reverse direction. With no applied input signal the series circuit comprising capacitor 11 and diode 10, therefore, has a very high impedance in respect to the forward impedance of rectifier 21.

Operation of the device under these conditions is illustrated by FIG. 4. When the source signal voltage has a forward bias potential in respect to the storage diode and rectifier, as shown in FIG. 4–A, the storage diode is cut off by the charge storage means and offers a very high impedance while the rectifier is forwardly conducting and offers a very low impedance, so that the voltage across the rectifier, as shown in FIG. 4–B, is of a very small amplitude, corresponding to the rectifier forward voltage drop. Subsequently when the source signal polarity reverses during the following period of the voltage source waveform, both the rectifier and the storage diode are reverse biased and offer a high impedance so that, neglecting the effects of an output load current, the voltage appearing across the rectifier is substantially a reproduction of the source voltage. FIG. 4–E illustrates in dotted lines that neglecting the effects of filter capacitor 20, the output load current flows only during the intervals when the voltage source supplies a reverse bias voltage in respect to the storage diode and rectifier. The peak magnitude of the unfiltered load current corresponds to the ratio of source voltage amplitude to the sum of the load impedance 18 and the series impedance 16. The solid line of FIG. 4–E illustrates that the filtered load current has an amplitude approximately one-half of the peak amplitude of the unfiltered current pulses. When an input signal is applied between terminals 12 and 14' it is both voltage and current amplified so that the load current through load resistor 18 is an amplified out of phase function of the input signal. Current amplification takes place because of the ability of a small input current signal to control conduction of storage diode 10 and thus, by controlling its reverse impedance, vary the magnitude of the load current through resistor 18. As was previously explained, the storage diode is cut off under no input signal conditions because of the bias resulting from the charge on capacitor 11. The increase in charge magnitude is dependent upon the magnitude of the net excess diode forward current which is a function of the storage diode quality. A small magnitude input current signal approximating the magnitude of this net excess forward current by removing the capacitor bias, is capable of controlling diode forward current, diode storage and thus output load current.

Voltage amplification occurs because the voltage level of the input signal, applied between terminals 12 and 14' controls the storage within diode 10 by controlling the division of forward current between storage diode 10 and rectifier 21. It has been stated previously that the amplitude of the forward current flowing through series impedance 16 is a function of the voltage amplitude of the source signal and the magnitude of impedance 16. This fixed amplitude forward current may be divided between the storage diode 10 and rectifier 21 so that in one extreme the entire forward current flows through rectifier 21 and none through storage diode 10. Under this condition there is no storage and the storage diode, as well as the rectifier, offers a high reverse impedance in respect to load impedance 18 so that during the reverse bias period of the source signal the impedance of the storage diode and rectifier circuit between terminals 14 and 15 is extremely high in respect to the load impedance 18, resulting in a maximum output load current. Under the other extreme condition the entire forward current passes through the storage diode 10 and none passes through rectifier 21 resulting in maximum storage and minimum storage diode reverse impedance. Under this condition there is a maximum reverse current flow through the storage diode 10 and a minimum revers impedance so that during the reverse bias period of the source signal the voltage across terminals 14 and 15 as well as the load current is minimal. By varying the voltage level of the input signal, the output load voltage and current may be varied by the shift of the entire forward current between the storage diode 10 and the rectifier 21. The voltage level of the input signal governs the forward current distribution between the storage diode 10 and a rectifier 21 because the input signal voltage, between terminals 12 and 14' equals the difference between the storage diode forward voltage drop and the rectifier forward voltage drop, so that a change in input voltage, $\Delta V_1 = \Delta V_{fs} - \Delta V_{fd}$, and because a change in forward current through one of the two devices results in an equal and opposite change of current through the other device, i.e. $\Delta I_{fs} = -\Delta I_{fd}$. FIG. 3 illustrates the variation in voltage and current of one device in respect to that of the other device. Assuming an initial operating point, shown as 1 in FIG. 3–A and FIG. 3–B, the storage diode forward current, indicated on the ordinate of FIG. 3–A, has a smaller amplitude than the forward current through the rectifier, $I_{fd}$, indicated on the ordinate of FIG. 3–B. A positive increase of the input signal voltage results in an increased storage diode forward current, as shown by the ordinate of operating point 2 of FIG. 3–A, because of the increase forward voltage drop across the storage diode, indicated as $\Delta V_{fs}$ on the abscissa of FIG. 3–A. The rectifier forward current is decreased by the amount of the increase of forward diode current, as shown by the ordinate of FIG. 3–B in view of the small decrease in rectifier forward voltage, indicated by the abscissa of FIG. 3–B, which equals the algebraic difference of the change in applied input voltage and storage diode forward voltage.

The effect of the input signal amplitude upon circuit operation is illustrated by FIG. 4. As has been previously described, when no input signal is applied, the storage diode and rectifier circuit offer a high reverse impedance across terminals 14 and 15 during the reverse bias period of the source signal, so that there is a large amplitude output load current. Upon application of a small amplitude input signal, there is some conduction, and thus some storage in the storage diode during the forward bias period. Therefore a reverse current flows during the small storage time interval, indicated as $T_s$ in FIG. 4–C. During this interval the reverse impedance of the storage diode is substantially lowered so that the average reverse impedance of the storage diode for the reverse bias period is lower than during no applied input signal conditions. This results in a corresponding decrease of load current as shown in FIG. 4–F. The dotted line in FIG. 4–F indicates the load current which would flow without filter capacitor 20. It may be seen that there is an initially low amplitude load current during the time period $T_s$ with a subsequent increase in load current amplitude toward a maximum amplitude level. The actual, filtered, load current thus has a lower amplitude than during no applied input signal operation, as is shown by the solid line of FIG. 4–F. When a large amplitude input signal is applied between terminals 12 and 14' there is a further increase in the time interval $T_s$, the time of reverse current conduction, as shown by FIG. 4–D and FIG. 4–G. This results in a corresponding decrease of average load current as is shown by the solid line of FIG. 4–G. Thus it may be seen that the load current amplitude, and also the load voltage amplitude is an amplified, but inverse, function of the amplitude of the input signal.

In one satisfactorily operating circuit of the above described embodiment, the following parameters were used, but it should be noted that these are exemplary and should not be considered as limiting the scope of the invention:

Storage diode 10___________General Electric type 1N93.
Diode rectifier 21__________General Electric type 1N70.
Series impedance 16________2200 ohms.
Capacitor 11______________ .01 mfd.

| | |
|---|---|
| Coupling resistor 25 | 1000 ohms. |
| Load resistor 18 | 1000 ohms. |
| Diode rectifier 19 | General Electric type 1N69. |
| Supply source frequency | 1 megacycle. |
| Supply source voltage | ±6 volts. |

The development of diode amplifiers having both current and voltage gain makes possible the construction of many circuits. Thus FIG. 5 illustrates how amplifier stages are cascaded and how D.-C. coupling of stages is obtained. Since corresponding elements of FIG. 5 have already been described in connection with FIG. 1 they are identified by the same reference numbers and are not again described.

In FIG. 6 there is shown another embodiment in which the diode amplifier circuit shown in FIG. 1 is utilized in a multi-stage A.-C. coupled diode amplifier. The amplifier requires an input signal of 5 millivolts at a 20,000 ohm impedance level with an output of approximately 2 volts across a 150 ohm load resistance. The overall power gain of approximately 74 db, combined with the aforementioned impedance levels, permits operation from a phonograph pickup directly into a speaker without the necessity for coupling transformers. It may be seen that the circuit is comprised of six basic diode amplifier stages having a substantially identical arrangement of components, although the magnitude of like elements differs in view of the cascading of the stages. An audio input signal is connected to volume control 24 whose output is capacitance coupled to the input of the first diode amplifier stage, comprising storage diode 10, and the output of that stage is sequentially capacitance coupled to the following five cascaded stages. The bias level of the last two stages is controlled by means of a voltage taken from the source signal and applied through non-storage rectifier 47 to diodes 60 and 70 respectively through series resistors 27 and 37. The operating bias level is obtained by proper selection of series resistors 27 and 37 whose magnitude may be determined from the input current applied to the storage diodes and from the supply source voltage. The bias applied to the anodes of the diodes is determined by the difference between a source supply voltage and the voltage drop across resistors 27 and 37 respectively which in turn is equal to the product of the diode current and the resistance magnitude. This circuit has the advantage of providing bias which is proportional to the amplitude of the source voltage, so as to maintain bias for proper operation with some variation in source voltage.

In one satisfactorily operating circuit of this embodiment, the following parameters were utilized; but it should be noted that these are exemplary and should not be considered as limiting the scope of the invention:

| | |
|---|---|
| Storage diodes 10, 20, 40, 50, 60 and 70 | General Electric type 1N93. |
| Diode rectifiers 21, 22, 32, 42, 52 and 62 | General Electric type 1N69. |
| Series impedance 16 | 22,000 ohms. |
| Series impedance 26 | 20,000 ohms. |
| Series impedance 36 | 10,000 ohms. |
| Series impedance 46 | 5,100 ohms. |
| Series impedance 56 | 2,000 ohms. |
| Series impedance 76 | 1,000 ohms. |
| Coupling resistors 25 and 35 | 10,000 ohms. |
| Coupling resistor 45 | 5,100 ohms. |
| Coupling resistor 55 | 2,400 ohms. |
| Coupling resistor 65 | 1,000 ohms. |
| Coupling capacitors 23, 33, 43, 53, 63 and 73 | 4 mfd. |
| Capacitors 11, 31, 41, 51, 61 and 71 | .01 mfd. |
| Volume control 24 | 500,000 ohm potentiometer. |
| Biasing diode 47 | General Electric type 1N52. |
| Biasing resistor 27 | 150,000 ohms. |
| Biasing resistor 37 | 15,000 ohms. |

In FIG. 7 there is shown a schematic circuit diagram illustrating how the diode amplifier of FIG. 1 may be incorporated in a push-pull amplifier which provides for an increase in the output power. The circuit actually consists of two diode amplifiers with the storage diode and rectifiers of one of the amplifiers being reversed in respect to the storage diode and rectifier of the other amplifier. Consequently, when the source signal is applied to these amplifiers, carriers will be injected in one amplifier, while carriers will be removed in the other amplifier. As a result of this arrangement power is delivered to the load resistance 118, connected between the outputs of the two amplifiers, during both the positive and negative portions of the clock cycle. The audio input signal is applied between terminals 112 and 124 connected to primary winding 115 of coupling transformer 127, and signals of opposite phase are capacitance coupled from the ends of center tapped secondary winding 119 of the transformer to storage diodes 110 and 112 respectively. It will be seen that the diode amplifier circuit comprising storage diode 110 conforms to that shown in FIG. 1, including charge storage means 111, rectifier 121, current limiting means 116. Terminals 117 and 114 are adapted to be connected to a bipolar voltage source of predetermined frequency. A bias circuit, including resistor 125 which is connected from the anode of storage diode 110 to a source of positive potential, is utilized to obtain the proper voltage level on the anode of the storage diode. The second diode amplifier, comprising storage diode 112 and rectifier 122 also includes the charge storage means 113, the current limiting means 137 and a biasing circuit which consists of biasing resistor 126 connected to a negative potential source. In view of the reverse direction of storage diode 112 and rectifier 127 in respect to storage diode 110 and rectifier 121 it may be seen that the two amplifiers supply power to the load during alternate periods of the applied source signal. Thus if the source signal applied to terminal 117 is negative storage diode 110 will be biased in the forward direction and carriers will be injected, whereas storage diode 112 will be reverse biased and injected carriers will be removed. The audio power capability of this type of circuit is approximately twice that possible with a single stage.

In FIG. 8 there is shown a schematic circuit diagram illustrating how the diode amplifier of FIG. 1 may be incorporated in a dynamic "flip-flop" circuit, by connecting the output of each of two direct coupled amplifiers to the input of the other amplifier. It may be seen that one amplifier stage comprises storage diode 210 and rectifier 221 in conjunction with series impedance, i.e. current limiting means 216, charge storage means, i.e. capacitor 211 and bias resistor 225. The second amplifier stage comprises storage diode 230, rectifier 241, series impedance 236, charge storage means 231, and biasing resistor 245. Biasing resistors 225 and 245 are adapted to be connected to a common bias source, indicated as −V. The output of the first amplifier is coupled from terminal 215 at the junction of storage diode 210 and series impedance 216 through coupling resistor 201 to input terminal 239 of the second amplifier. The output of the second amplifier is taken from terminal 235, the junction between storage diode 230 and series impedance 236 and is coupled through series resistor 202 to input terminal 219 of the first amplifier. The circuit operates as follows: assuming that the input of the first amplifier at terminal 219 is a positive D.C. potential, carriers will be injected into storage diode 210 during the negative half cycle of the applied source of signal while on the positive half cycle these carriers will be swept out with a resultant lowering in the reverse impedance of diode 210. Since the impedance of the series circuit comprising capacitor 211 and storage diode 210 is therefore low during both the positive and negative portion of the source voltage, a low magnitude voltage is coupled from output terminal 215 of the first amplifier to input terminal 239 of the second amplifier. The net voltage applied to the anode of storage diode 230, of the second amplifier, is therefore negative, in view of the negative bias applied through biasing resistor 245, so that the diode is biased to cut off and no carriers are injected. Consequently the positive half of the source signal is substantially reproduced at output terminal 235 of the second amplifier. This positive voltage when applied to the input of the first amplifier maintains the first amplifier in conduction. An appropriate signal at either the first amplifier input terminal 219 or the second amplifier input 239 will act to switch the state of the flip-flop circuit.

While the principles of the invention have now been made clear, there will be immediately obvious to those skilled in the art many modifications in structure, arrangement, proportions, the elements and components used in the practice of the invention, and otherwise, which are particularly adapted for specific environments and operating requirements without departing from those principles. Thus it should be understood that a variety of additional circuits may be constructed which utilize the diode amplifier circuit concept disclosed here. The attendant claims are therefore intended to cover and embrace any such modifications within the limits only of the true spirit and scope of the invention.

What we claim as new and desire to secure by Letters Patent of the United States is:

1. An electrical circuit comprising: a storage diode, a bipolar voltage source of predetermined frequency, an impedance, and a capacitor; means serially connecting said storage diode with said source and said impedance and said capacitor in a closed path; a rectifier; means connecting said rectifier across said diode and said capacitor, said rectifier being poled in the direction of said diode in respect to said voltage source; input signal means coupled across said capacitor; and output signal means coupled across said rectifier.

2. A diode amplifier circuit comprising an impedance and a rectifier; means serially connecting said rectifier to said impedance; means for coupling said impedance and said rectifier in series with a bipolar voltage source of predetermined frequency; a storage diode, a capacitor, means serially connecting said storage diode and capacitor across said rectifier said diode being poled in the direction of said rectifier in respect to said voltage source; signal input means connected across said capacitor, and signal output means connected across said rectifier.

3. An electrical circuit comprising: a closed loop series circuit including a voltage source, current limiting means, a storage diode and charge storage means; rectifying means connected in parallel with the series combination of said storage diode and said charge storage means, said voltage source being constructed to provide a source signal of predetermined frequency having cycles of consecutive first and second substantially identical waveform segments of opposing polarity; said storage diode and rectifying means being poled for forward conduction in respect to the polarity of said first waveform segment, said storage diode being constructed so as to pass a forward diode current when forwardly biased by the first waveform segment of the source signal and to pass a reverse diode current by virtue of the diode minority carrier storage effect when reversely biased during said second waveform segment of the source signal, said forward diode current exceeding said reverse diode current, whereby there is a net diode current in the forward direction during each cycle of the source signal, said charge storage means being constructed to store said net diode current so as to bias said diode and restrict diode conduction; input means coupled across said charge storage means and adapted to provide an input signal capable of modifying the bias at said storage means so as to regulate conduction through said diode and to additionally control the distribution of forward current between said diode and said rectifying means, thereby to control the degree of storage within said storage diode; and output means connected across said rectifying means, said storage diode being connected to said output means so as to supply an output signal thereto.

4. An electrical circuit comprising a closed loop series circuit, said series circuit including a voltage source, current limiting means, a storage diode and charge storage means; rectifying means connected in parallel with the series combination of said storage diode and said charge storage means; said voltage source being constructed to provide a source signal of predetermined frequency having cycles of consecutive first and second substantially identical waveform segments of opposing polarity; said storage diode and rectifying means being poled for forward conduction in respect to the polarity of said first waveform segment, said storage diode being constructed so as to pass a forward diode current when forwardly biased by the first waveform segment of the source signal and to pass a reverse diode current by virtue of the diode minority carrier storage effect when reversely biased during said second waveform segment of the source signal, said forward diode current exceeding said reverse diode current, whereby there is a net diode current in the forward direction during each cycle of the source signal; said charge storage means being constructed to store said net diode current so as to bias said diode and restrict diode conduction; input means coupled across said charge storage means adapted to provide an input signal capable of modifying the bias at said storage means so as to regulate conduction through said diode and to additionally control the distribution of forward current flow through said diode and said rectifying means thereby to control the reverse impedance of said storage diode during application of said second waveform segments; and output means, said output means being connected across said rectifying means for deriving a signal which is an amplified function of said input current and input voltage.

5. Apparatus as in claim 4 wherein said output means include rectifying means and filtering means, said rectifying means passing current in said output means only during said second waveform segment when said storage diode is reverse biased, and said filtering means removing any source signal component of said predetermined frequency.

6. A diode amplifier circuit wherein diode charge storage is controlled as a function of applied signal voltage and signal current comprising: a storage diode; charge storage means connected in series combination with said storage diode; current limiting means connected in series with said series combination to apply a bipolar source voltage of predetermined frequency to said series combination, said source voltage polarity being such as to provide to said storage diode a forward bias for one-half of each cycle and a reverse bias for the other half of each cycle, said storage diode being constructed so as to inject carriers and pass a forward current when forward biased, and to sweep out carriers and pass a reverse current when reverse biased, said forward current exceeding said reverse current so as to provide a net forward current for each cycle of said supply voltage; said charge storage means being constructed to store said net forward current so as to bias said diode against conduction; unilaterally conducting means connected in parallel with the series combination of said storage diode and charge storage means and poled in the direction of said storage diode in respect to said source voltage; input means connected in parallel with said charge storage means and in series with said storage diode and said unilaterally conducting means, said input means adapted to supply an input current and voltage signal so that the reverse impedance of said diode is a function of said input current and input voltage signals; and output means, said output means being coupled across said unilaterally conducting means to provide an amplified function of the input current and voltage signal.

7. A diode amplifier circuit wherein diode charge storage is controlled as a function of applied signal voltage and signal current comprising: a storage diode having a body of semiconductor material including a P-N junction therein and further having anode and cathode electrodes on opposite sides respectively of said junction, said semiconductor material of said body being capable of transient storage of electrical carriers injected therein; charge storage means connected in series combination with said storage diode; current limiting means to apply a biploar source voltage of predetermined frequency to said series combination, said source voltage polarity being such as to provide to said storage diode a forward bias for one-half of each cycle and a reverse bias for the other half of each cycle, said storage diode being constructed so as to inject carriers and pass a forward current when forward biased, and to sweep out carriers and pass a reverse current when reverse biased, said forward current exceeding said reverse current so as to provide a net forward current for each cycle of said supply voltage; said charge storage means being constructed to store said net forward current so as to bias said diode against conduction; unilaterally conducting means connected in parallel with the series combination of said storage diode and charge storage means and poled in the direction of said storage diode in respect to said source voltage; input means connected in parallel with said charge storage means and in series with said storage diode and said unilaterally conducting means, said input means adapted to supply an input current signal and an input voltage signal, said input current signal opposing said stored net forward current on said charge storage means so as to control storage diode bias, and said input voltage signal additionally controlling the distribution of forward current between said storage diode and said unilaterally conducting means, whereby the reverse impedance of said diode is controlled as a function of applied signal voltage and signal current; output means for deriving an amplified function of said input signal, said output means being connected across said series combination of said storage diode and said storage means.

References Cited in the file of this patent

UNITED STATES PATENTS

| | | |
|---|---|---|
| 2,666,816 | Hunter | Jan. 19, 1954 |
| 2,917,717 | Thorsen | Dec. 15, 1959 |

FOREIGN PATENTS

| | | |
|---|---|---|
| 166,800 | Australia | Feb. 6, 1956 |

OTHER REFERENCES

"Diode Amplifier," publication, National Bureau of Standards Technical News Bulletin, vol. 38, October 1956, No. 10.